United States Patent
Maa et al.

(10) Patent No.: US 6,562,703 B1
(45) Date of Patent: May 13, 2003

(54) MOLECULAR HYDROGEN IMPLANTATION METHOD FOR FORMING A RELAXED SILICON GERMANIUM LAYER WITH HIGH GERMANIUM CONTENT

(75) Inventors: Jer-Shen Maa, Vancouver, WA (US); Douglas J. Tweet, Camas, WA (US); Sheng Teng Hsu, Camas, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/099,374

(22) Filed: Mar. 13, 2002

(51) Int. Cl.⁷ .................................. H01L 21/265
(52) U.S. Cl. ............... 438/518; 438/522; 438/933; 257/55
(58) Field of Search .................. 438/518, 522, 438/604, 933; 257/55

(56) References Cited

U.S. PATENT DOCUMENTS 6,323,108 B1 * 11/2001 Kub et al. .................. 438/458
6,326,667 B1 * 12/2001 Sugiyama et al. .......... 257/347

OTHER PUBLICATIONS

U.S. Patent application Publication US 2003/0003679 A1; Doyle et al.*
Bernard, S. et al.; Cooperative growth phenomena in silicon/germanium low–temperature epitaxy; Applied Physics Letters 53 (25), Dec. 19, 1988; pp. 2555–2557.*
Linder, KK. et al.; Reduction of dislocation density in mismatched SiGe/Si using a low–temperature Si buffer layer; Applied Physics Letters 70 (24), Jun. 16, 1997; pp. 3224–3226.*
Chen, H. et al.; Low–temperature buffer layer for growth of a low–dislocation–density SiGe layer on Si by molecular–beam epitaxy; J. Applied Physics 79 (2), Jan. 15, 1996; pp. 1167–1169.*
K. Rim, et al., 2001 Symposium on VLSI Technology Digest of Technical Papers, p. 59, IEEE 2001.
D. K. Nayak, K. Goto, A. Yutani, J. Murota, and Y. Shiraki, IEEE Transactions on Electron Devices, vol. 43, 1709 (1996).
M.K. Weldon et al, J. Vac. Sci. technol. B. 15, 1065, 1997.
S. Mantl et al, Nuclear Instruments and Methods in Physics Research B 147, 29, 1999.
H. Trinkaus et al, Appl. Phys. Lett., 76, 3552, 2000.
M. Luysberg, et al., "Relaxation of Si1 –xGex buffer layers on Si(100) through Helium implantation", Abstracts of the 2001 MRS Spring Meeting, Abstract #P5.4, Apr. 18, 2001.

(List continued on next page.)

Primary Examiner—Olik Chaudhuri
Assistant Examiner—Fernando Toledo
(74) Attorney, Agent, or Firm—David C. Ripma; Matthew D. Rabdau; Scott C. Krieger

(57) ABSTRACT

A method is provided for forming a relaxed silicon germanium layer with a high germanium content on a silicon substrate. The method comprises: depositing a single-crystal silicon (Si) buffer layer overlying the silicon substrate; depositing a layer of single-crystal silicon germanium ($Si_{1-x}Ge_x$) overlying the Si buffer layer having a thickness of 1000 to 5000 Å; implanting the $Si_{1-x}Ge_x$ layer with ionized molecular hydrogen ($H_2^+$) a projected range of approximately 100 to 300 Å into the underlying Si buffer layer; optionally, implanting the $Si_{1-x}Ge_x$ layer with a species selected such as boron, He, or Si; annealing; and, in response to the annealing, converting the $Si_{1-x}Ge_x$ layer to a relaxed $Si_{1-x}Ge_x$ layer. Optionally, after annealing, an additional layer of single-crystal $Si_{1-x}Ge_x$ having a thickness of greater than 1000 Å can be deposited overlying the relaxed layer of $Si_{1-x}Ge_x$.

28 Claims, 2 Drawing Sheets

OTHER PUBLICATIONS

Q.-Y. Tong and U. Gosele, U.S. patent application 08/866,951 (1997).

L.-J. Huang, Q.-Y. Tong, T.-H. Lee, Y.-L. Chao, and U.M. Gosele, Electrochemical Society Proceedings, vol. 98–1, p. 1373 (1998).

A. Agarwal, et al., Proceedings of the 1997 IEEE International SOI Conference, p. 44, (1997).

G.F. Cerofolini, L. Meda, R. Balboni, F. Corni, S. Frabboni, G. Ottaviani, R. Tonini, M. Anderle, and R. Canteri, Physical Review B, vol. 46, p. 2061 (1992).

* cited by examiner

MOLECULAR HYDROGEN IMPLANTATION METHOD FOR FORMING A RELAXED SILICON GERMANIUM LAYER WITH HIGH GERMANIUM CONTENT

BACKGROUND OF THE INVENTION

1. Field of the Invention

This invention generally relates to semiconductor fabrication and, more particularly, to a method for forming a relaxed silicon germanium film with high germanium content on a silicon substrate.

2. Description of the Related Art

In enhanced mobility MOSFET device applications, thick relaxed silicon (Si) germanium (Ge) layers have been used as substrates for thin strained Si layers, to increase carrier mobility for both NMOS and PMOS devices. Compared with bulk Si devices, enhancements in electron mobility of up to 70%, for devices with a channel length of less than 70 nanometers (nm), have been reported. Enhancements of up to 40% in high-field hole mobility for long-channel devices have also been found.

Conventionally, a high quality relaxed $Si_{1-x}Ge_x$ buffer layer is formed by growing a several microns ($\mu$m) thick compositionally graded layer, where $Si_{1-x}Ge_x$ represents a silicon germanium film with a varying content of Ge. However, the density of threading dislocations is still high (typically >$10^6$/cm$^2$). In addition, the integration of $Si_{1-x}Ge_x$ film several microns thick into device fabrication has not been practical.

Alternative methods have been developed to efficiently relax strained SiGe layers on Si. The methods involving the implantation of hydrogen for the relaxation of strained SiGe layers have all utilized ionized atomic hydrogen (H$^+$). However, this implantation process is expensive due to the long time required. Helium implantation followed by an anneal step has also been explored to promote relaxation in SiGe films.

It would be advantageous if singly ionized molecular hydrogen (H$_2^+$) could be used in the relaxation of SiGe films to reduce the process time and cost, since this implantation process can be done at double the energy and half the current.

It would be advantageous if boron, He, Si, or other species could be co-implanted with singly ionized molecular hydrogen (H$_2^+$), as they have been shown to be effective for silicon on insulator (SOI) fabrication.

It would be advantageous if the implantation of H$_2^+$ alone, or with a species such as boron, could be used for relaxing strained SiGe films deposited epitaxially on Si substrates.

SUMMARY OF THE INVENTION

The present invention method produces a thick (100–500 nm) relaxed, smooth SiGe film with high Ge content of greater than 20–30% as a substrate layer for a tensile strained Si film to be used for high speed MOSFET applications. As mentioned above, atomic hydrogen (H$^+$) implantation has been shown to be effective for producing such films, however, this implantation process is very expensive due to the long process times required. The use of singly ionized molecular hydrogen (H$_2^+$) reduces the time and cost of the process, since the implant can be done at double the energy and half the current. Further, the H$_2^+$ can be implanted alone, or with boron, He, Si, or other species for the purpose of relaxing strained SiGe films deposited epitaxially on Si substrates.

Accordingly, a method is provided for forming a relaxed silicon germanium layer with a high germanium content on a silicon substrate. The method comprises: depositing a single-crystal silicon (Si) buffer layer overlying the silicon substrate; depositing a layer of single-crystal silicon germanium ($Si_{1-x}Ge_x$) overlying the Si buffer layer having a thickness of 1000 to 5000 Å; implanting the $Si_{1-x}Ge_x$ layer with ionized molecular hydrogen (H$_2^+$) a projected range of approximately 100 to 300 Å into the underlying Si buffer layer; optionally, implanting the $Si_{1-x}Ge_x$ layer with a species selected such as boron, helium (He), or Si; annealing; and, in response to the annealing, converting the $Si_{1-x}Ge_x$ layer to a relaxed $Si_{1-x}Ge_x$ layer. Optionally, after annealing, an additional layer of single-crystal $Si_{1-x}Ge_x$ having a thickness of greater than 1000 Å can be deposited overlying the relaxed layer of $Si_{1-x}Ge_x$.

Some aspects of the method include depositing a layer of $Si_{1-x}Ge_x$, where x is greater than 0.2. Alternately, a layer of graded $Si_{1-x}Ge_x$ can be deposited, where x varies in the range from 0.03 to 0.5. Further, the $Si_{1-x}Ge_x$ deposition process includes epitaxially growing the layer of $Si_{1-x}Ge_x$ at a temperature in the range of 400 to 600 degrees C. to form a strained layer of $Si_{1-x}Ge_x$ film, having a lattice structure that matches the underlying single-crystal Si buffer layer lattice structure.

The annealing process is conducted at a temperature in the range of 650 to 1000 degrees C. for a period of time in the range of 0.1 to 30 minutes. Alternately, the annealing process comprises: a low-temperature annealing at a temperature of approximately 250 degrees C. for a period of approximately 10 minutes; and, a high-temperature annealing at a temperature in the range of 650 to 1000 degrees C. for a period of time in the range of 0.1 to 30 minutes.

Additional details of the above-described method are provided below.

DETAILED DESCRIPTION OF THE PREFERRED EMBODIMENTS

Figure 1:
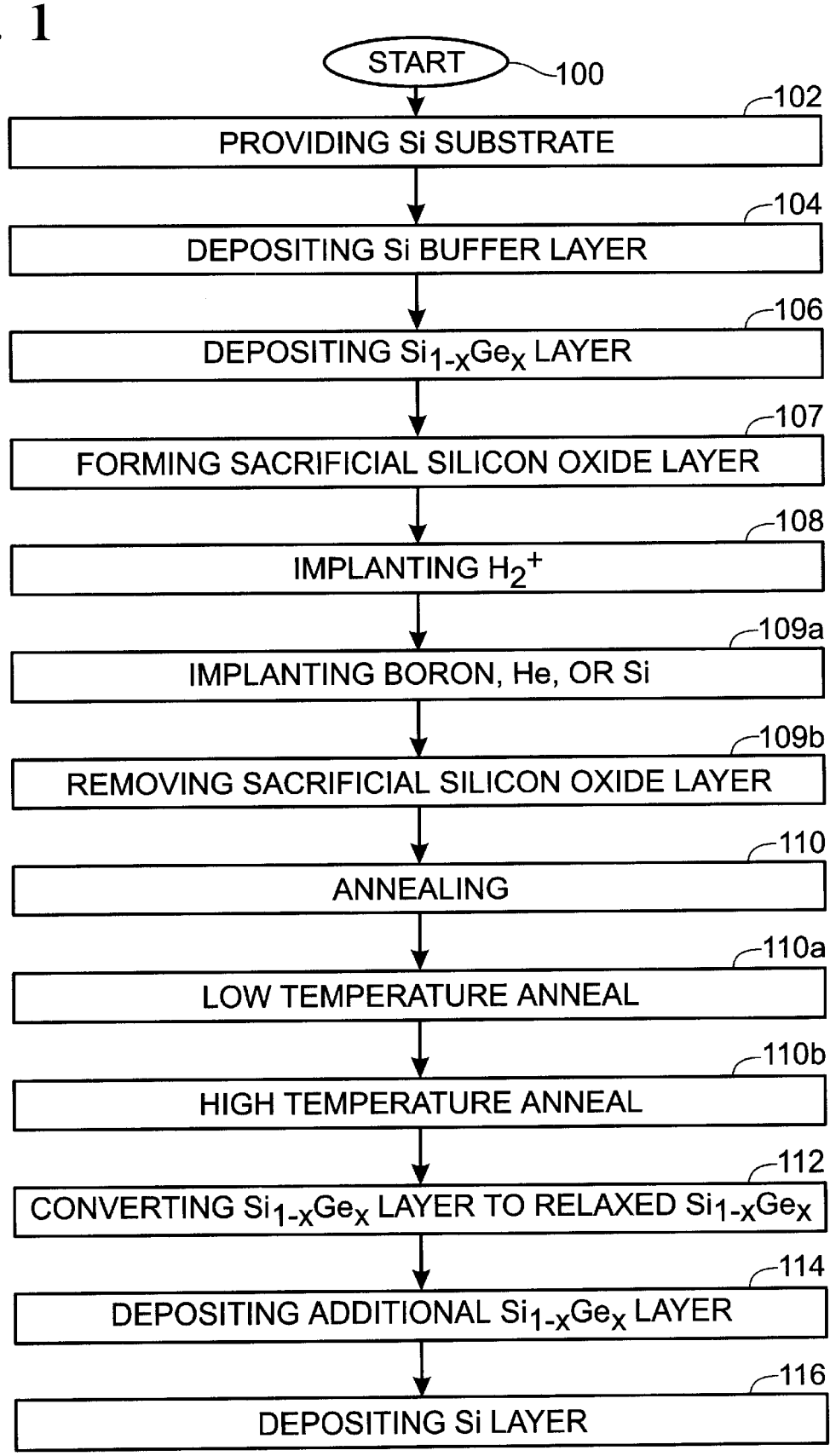
FIG. 1 is a flowchart illustrating the present invention method for forming a relaxed silicon germanium layer with a high germanium content.

FIG. 1 is a flowchart illustrating the present invention method for forming a relaxed silicon germanium layer with a high germanium content. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 100. Step 102 provides a silicon substrate. Step 104 deposits a single-crystal silicon (Si) buffer layer overlying the silicon substrate. In some aspects of the method, Step 104 includes depositing a Si layer having a thickness in the range of 50 to 1000 Å. Step 106 deposits a layer of single-crystal silicon germanium ($Si_{1-x}Ge_x$) overlying the Si buffer layer. Step 108 implants the $Si_{1-x}Ge_x$ layer with ionized molecular hydrogen ($H_2^+$). Step 110 anneals. Step 112, in response to the annealing, converts the $Si_{1-x}Ge_x$ layer to a relaxed $Si_{1-x}Ge_x$ layer.

In some aspects of the method, depositing a layer of $Si_{1-x}Ge_x$ overlying the Si buffer layer in Step 106 includes depositing a layer of $Si_{1-x}Ge_x$ where x is greater than 0.2. In other aspects, depositing a layer of $Si_{1-x}Ge_x$ overlying the Si buffer layer includes depositing a layer of graded $Si_{1-x}Ge_x$, where x varies in the range from 0.03 to 0.5. More specifically, x varies in the range from 0.03 to 0.2 at the Si layer interface, and x varies from 0.2 to 0.5 at the $Si_{1-x}Ge_x$ layer top surface. The value of x increases with the layer thickness, with an increase that can be a linear or step-wise increase.

In some aspects, depositing a layer of $Si_{1-x}Ge_x$ overlying the Si buffer layer in Step 106 includes depositing a layer of $Si_{1-x}Ge_x$ having a thickness in the range of 1000 to 5000 Å. In other aspects, depositing a layer of $Si_{1-x}Ge_x$ overlying the Si buffer layer includes epitaxially growing the layer of $Si_{1-x}Ge_x$ at a temperature in the range of 400 to 600 degrees C. In some aspects of Step 106 a strained layer of $Si_{1-x}Ge_x$ film is formed, having a lattice structure that matches the underlying single-crystal Si buffer layer lattice structure.

In some aspects of the method, implanting the $Si_{1-x}Ge_x$ layer with ionized molecular hydrogen ($H_2^+$) in Step 108 includes implanting $H_2^+$ a projected range of approximately 100 to 300 Å into the underlying Si buffer layer. More specifically, Step 108 includes implanting a dosage of $H_2^+$ in the range of $2\times10^{14}/cm^2$ to $2\times10^{16}/cm^2$ and with an energy of in the range of 10 kilo electron volts (keV) to 100 keV.

In some aspects of the invention an optional step is performed. Step 109a, prior to annealing (Step 110), implants the $Si_{1-x}Ge_x$ layer with a species selected from the group including boron, He, and Si. Step 109a can be performed either prior to the implanting of ionized molecular hydrogen (Step 108), or subsequent to Step 108.

Implanting the $Si_{1-x}Ge_x$ layer with a species selected from the group including boron, He, and Si in Step 109a includes implanting a dosage in the range of $1\times10^{12}/cm^2$ to $1\times10^{15}/cm^2$. A relationship exists between Steps 108 and 109a. The dosage of $H_2^+$ implanted in Step 108 can be reduced in response to increasing the dosage of the implanted species selected from the group including boron, He, and Si (Step 109a). Likewise, the dosage of the species in Step 109a can be reduced by increasing the dosage of $H_2^+$ in Step 108.

Some aspects of the method include further steps. Step 107 forms a sacrificial layer of silicon oxide overlying the $Si_{1-x}Ge_x$ layer, prior to implanting (Steps 108 and 109a). Step 109b removes the sacrificial silicon oxide layer after implantation, before the annealing in Step 110.

In some aspects, annealing in Step 110 includes annealing at a temperature in the range of 650 to 1000 degrees C. for a period of time in the range of 0.1 to 30 minutes. Alternately, annealing includes substeps. Step 110a is a low-temperature annealing at a temperature of approximately 250 degrees C. for a period of approximately 10 minutes. Step 110b is a high-temperature annealing at a temperature in the range of 650 to 1000 degrees C. for a period of time in the range of 0.1 to 30 minutes. Typically, Step 110 is performed in an atmosphere such as a vacuum, nitrogen, argon, or other inert gases.

Some aspects of the method include further steps. Step 114, after annealing (Step 110), deposits an additional layer of single-crystal $Si_{1-x}Ge_x$ overlying the relaxed layer of $Si_{1-x}Ge_x$. In some aspects, Step 116, after annealing, deposits a layer of tensile strained single-crystal Si overlying the relaxed $Si_{1-x}Ge_x$ layer. Note that Step 114 can be performed without Step 116. Likewise, Step 116 can be preformed without Step 114, or both steps can be preformed.

In some aspects, depositing an additional layer of single-crystal $Si_{1-x}Ge_x$ overlying the relaxed layer of $Si_{1-x}Ge_x$ in Step 114 includes depositing an additional layer having a thickness of greater than 1000 Å. In some aspects, Step 114 includes epitaxially growing a layer of tensile strained Si, having a lattice structure matching the lattice structure of the underlying $Si_{1-x}Ge_x$ layer. Depositing a layer of Si overlying the relaxed $Si_{1-x}Ge_x$ layer in Step 116 includes depositing a Si layer having a thickness in the range of 50 to 300 Å.

Figure 2:
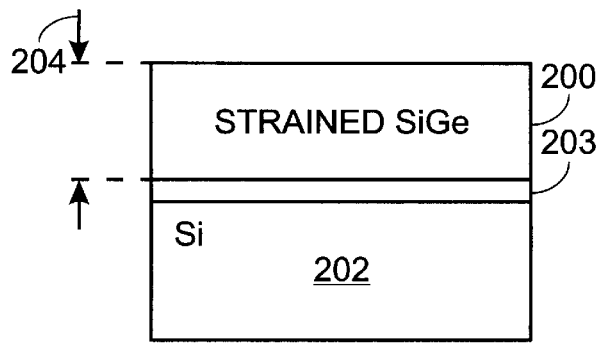
FIG. 2 is a cross-sectional view showing an initial step in the completion of a relaxed SiGe film produced in accordance with the present invention method.

FIG. 2 is a cross-sectional view showing an initial step in the completion of a relaxed SiGe film produced in accordance with the present invention method. A strained SiGe film 200 is shown deposited on a Si substrate layer 202. In some aspects, a silicon buffer layer 203 of 50 to 1000 Å is deposited on the silicon substrate 202 underlying the SiGe layer 200. The SiGe film has a thickness 204 of 1000 to 5000 Å. The Ge content in the SiGe film 200 can be up to 30% or greater. Alternatively, a graded Ge profile can be used. The growth conditions and source gases are chosen to minimize surface roughness while ensuring good crystallinity. A low temperature growth (400–600° C.) can be used to produce a metastable strained SiGe film 200.

Figure 3:
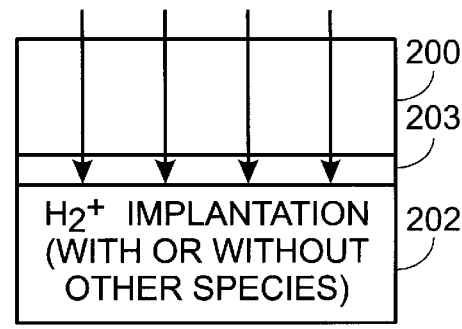
FIG. 3 illustrates the SiGe film of FIG. 2 during implantation.

FIG. 3 illustrates the SiGe film of FIG. 2 during implantation. The Si buffer layer is implanted with $H_2^+$, with or without other species, such as boron, He, or Si. The $H_2^+$ can be implanted either before or after the other species. The dose of $H_2^+$ is in the range of $2e14/cm^2$ ($2\times10^{14}/cm^2$) to $2e16/cm^2$, but depends on the dose of the co-implanted species. The dose of the other species (e.g. boron, He, or Si) varies over a wide range, such as from $1e12/cm^2$ to $1e15/cm^2$. Generally, the higher the dose of the co-implanted species, the more the $H_2^+$ dose can be reduced. The implant energies depend on SiGe thickness, and are chosen so that the implantation ranges are similar. To avoid contamination in the implantation steps, a thin sacrificial silicon oxide (not shown) in the range of 50 Å to 300 Å thick can be deposited on the first SiGe layer 200.

Figure 4:
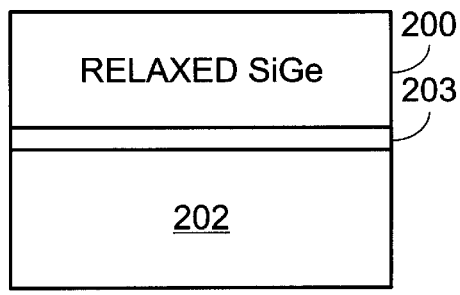
FIG. 4 illustrates the SiGe film of FIG. 3 during annealing.

FIG. 4 illustrates the SiGe film of FIG. 3 during annealing. The thermal annealing step converts the strained SiGe film into relaxed SiGe. Annealing is performed in an inert ambient, such as Ar, at a temperature in the range of 650° C. to 1000° C. Alternatively, a low temperature pre-anneal can be used, for example 250° C. for 10 minutes, followed by the higher temperature anneal. This step relaxes the strained SiGe layer while maintaining a smooth surface.

Figure 5:
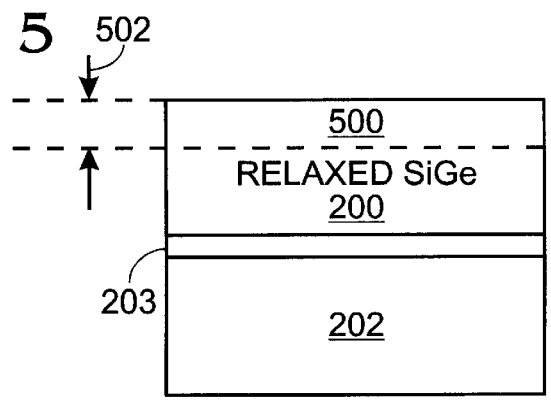
FIG. 5 illustrates the SiGe film of FIG. 4 with the optional deposition of an additional relaxed SiGe film overlying the initial relaxed SiGe film.

FIG. 5 illustrates the SiGe film of FIG. 4 with the optional deposition of an additional relaxed SiGe film 500 overlying the initial relaxed SiGe film 200. The additional SiGe film can have a thickness 502 of greater than 1000 Å.

Figure 6:
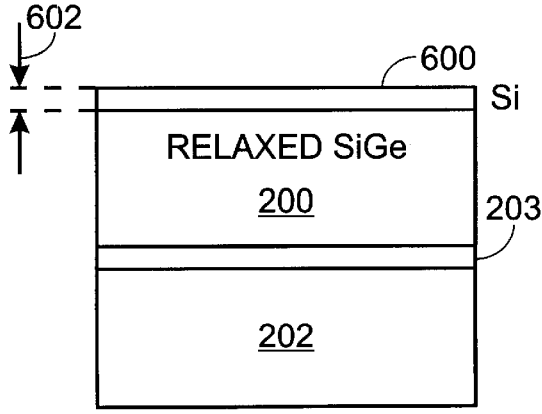
FIG. 6 illustrates the SiGe film of FIG. 3 or 4 with the optional deposition of a tensile strained Si film overlying the relaxed SiGe film.

FIG. 6 illustrates the SiGe film of FIG. 3 or 4 with the optional deposition of a tensile strained Si film 600 overlying the relaxed SiGe film 200. The Si film 600 typically has a thickness 602 of 50 to 300 Å.

The use of singly ionized molecular hydrogen ($H_2^+$) to relax strained SiGe films was demonstrated in a series of experiments. SiGe films of approximately 300 nm thick were epitaxially grown on six-inch Si(001) wafers. The films had a graded Ge profile, varying linearly from approximately 20% at the SiGe/Si interface to approximately 30% at the wafer surface. The as-deposited films were strained to be lattice-matched to the Si substrates. These wafers were then implanted with 1e16/cm² $H_2^+$ ions at energies from 58 keV to 66 keV. Finally, the wafers were annealed at 800° C. for 9 minutes in an argon ambient.

Nomarski microscopy images of the wafer surfaces as well as x-ray diffraction (XRD) reciprocal space maps near the Si(224) substrate peak were observed. If the implant is too shallow, the SiGe film has a high degree of lattice relaxation (R), but the lattice planes are not well-oriented (giving a broad XRD peak) and the surface becomes rough. With higher implant energy the SiGe film still has R>80%, but the surface roughness decreases considerably. At even higher implant energies the film relaxation decreases somewhat, but the surface is very smooth. By adjusting implant energy and dose, a compromise was found, giving sufficient lattice relaxation, while maintaining good crystalline quality and a smooth surface.

A method of using ionized molecular hydrogen ($H_2^+$), with or without additional species, has been provided for forming a relaxed SiGe film overlying a Si substrate. Some process specifics have been given as examples. However, the present invention is not limited to merely these examples. Other variations and embodiments will occur to those skilled in the art.

We claim:

1. A method for forming a relaxed silicon germanium layer with a high germanium content, the method comprising:

providing a silicon substrate;

depositing a single-crystal silicon (Si) buffer layer overlying the silicon substrate;

depositing a layer of single-crystal silicon germanium ($Si_{1-x}Ge_x$) overlying the Si buffer layer;

implanting the $Si_{1-x}Ge_x$ layer with ionized molecular hydrogen ($H_2^+$);

annealing; and, in response to the annealing, converting the $Si_{1-x}Ge_x$ layer to a relaxed $Si_{1-x}Ge_x$ layer.

2. The method of claim 1 wherein depositing a layer of $Si_{1-x}Ge_x$ overlying the Si buffer layer includes depositing a layer of $Si_{1-x}Ge_x$, where x is greater than 0.2.

3. The method of claim 1 wherein depositing a layer of $Si_{1-x}Ge_x$ overlying the Si buffer layer includes depositing a layer of graded $Si_{1-x}Ge_x$ where x varies in the range from 0.03 to 0.5.

4. The method of claim 1 wherein depositing a layer of $Si_{1-x}Ge_x$ overlying the Si buffer layer includes depositing a layer of graded $Si_{1-x}Ge_x$, where x varies in the range from 0.03 to 0.2 at the Si layer interface, and where x varies from 0.2 to 0.5 at the $Si_{1-x}Ge_x$ layer top surface.

5. The method of claim 3 wherein depositing a layer of $Si_{1-x}Ge_x$ overlying the Si buffer layer includes depositing a layer of graded $Si_{1-x}Ge_x$, where the value of x increases with the layer thickness, with an increase selected from the group including a linear increase and a step-wise increase.

6. The method of claim 1 wherein depositing a layer of $Si_{1-x}Ge_x$ overlying the Si buffer layer includes depositing a layer of $Si_{1-x}Ge_x$ having a thickness in the range of 1000 to 5000 Å.

7. The method of claim 1 wherein depositing a layer of $Si_{1-x}Ge_x$ overlying the Si buffer layer includes epitaxially growing the layer of $Si_{1-x}Ge_x$ at a temperature in the range of 400 to 600 degrees C.

8. The method of claim 1 wherein depositing a layer of $Si_{1-x}Ge_x$ overlying the Si buffer layer includes forming a strained layer of $Si_{1-x}Ge_x$ film, having a lattice structure that matches the underlying single-crystal Si buffer layer lattice structure.

9. The method of claim 1 wherein implanting the $Si_{1-x}Ge_x$ layer with ionized molecular hydrogen ($H_2^+$) includes implanting $H_2^+$ a projected range of approximately 100 to 300 Å into the underlying Si buffer layer.

10. The method of claim 9 wherein implanting the $Si_{1-x}Ge_x$ layer with ionized molecular hydrogen ($H_2^+$) includes implanting a dosage of $H_2^+$ in the range of $2\times10^{14}$/cm² to $2\times10^{16}$/cm² and with an energy of in the range of 10 keV to 100 keV.

11. The method of claim 1 further comprising:

prior to annealing, implanting the $Si_{1-x}Ge_x$ layer with a species selected from the group including boron, He, and Si.

12. The method of claim 11 wherein implanting the $Si_{1-x}Ge_x$ layer with a species selected from the group including boron, He, and Si including implanting prior to the ionized molecular hydrogen implantation.

13. The method of claim 11 wherein implanting the $Si_{1-x}Ge_x$ layer with a species selected from the group including boron, He, and Si including implanting subsequent to the ionized molecular hydrogen implantation.

14. The method of claim 11 wherein implanting the $Si_{1-x}Ge_x$ layer with a species selected from the group including boron, He, and Si includes implanting a dosage in the range of $1\times10^{12}$/cm² to $1\times10^{15}$/cm².

15. The method of claim 11 wherein implanting the $Si_{1-x}Ge_x$ layer with ionized molecular hydrogen ($H_2^+$) includes reducing the dosage of $H_2^+$ in response to increasing the dosage of the implanted species selected from the group including boron, He, and Si.

16. The method of claim 1 further comprising:

forming a sacrificial layer of silicon oxide overlying the $Si_{1-x}Ge_x$ layer, prior to implanting; and, removing the sacrificial silicon oxide layer after implantation.

17. The method of claim 1 wherein annealing includes annealing at a temperature in the range of 650 to 1000 degrees C. for a period of time in the range of 0.1 to 30 minutes.

18. The method of claim 1 wherein annealing includes:

a low-temperature annealing at a temperature of approximately 250 degrees C. for a period of approximately 10 minutes; and, a high-temperature annealing at a temperature in the range of 650 to 1000 degrees C. for a period of time in the range of 0.1 to 30 minutes.

19. The method of claim 1 wherein annealing includes annealing in an atmosphere selected from the group including a vacuum, nitrogen, argon, and other inert gases.

20. The method of claim 1 further comprising:

after annealing, depositing an additional layer of single-crystal $Si_{1-x}Ge_x$ overlying the relaxed layer of $Si_{1-x}Ge_x$.

21. The method of claim 20 wherein depositing an additional layer of single-crystal $Si_{1-x}Ge_x$ overlying the relaxed layer of $Si_{1-x}Ge_x$ includes depositing an additional layer having a thickness of greater than 1000 Å.

22. The method of claim 1 further comprising:

after annealing, depositing a layer of tensile strained single-crystal Si overlying the relaxed $Si_{1-x}Ge_x$ layer.

23. The method of claim 22 wherein depositing a layer of Si overlying the relaxed $Si_{1-x}Ge_x$ layer includes depositing a Si layer having a thickness in the range of 50 to 300 Å.

24. The method of claim 22 wherein depositing a layer of Si overlying the relaxed $Si_{1-x}Ge_x$ layer includes epitaxially growing a layer of tensile strained Si, having a lattice structure matching the lattice structure of the underlying $Si_{1-x}Ge_x$ layer.

25. The method of claim 1 wherein depositing a single-crystal silicon buffer layer overlying the silicon substrate includes depositing a Si layer having a thickness in the range of 50 to 1000 Å.

26. A method for forming a relaxed silicon germanium layer with a high germanium content, the method comprising:

providing a silicon (Si) substrate;

depositing a single-crystal Si buffer layer having a thickness in the range of 50 to 1000 Å overlying the silicon substrate;

depositing a layer of strained layer of single-crystal silicon germanium ($Si_{1-x}Ge_x$) overlying the Si buffer layer having a thickness in the range of 1000 to 5000 Å, where x is greater than 0.2;

implanting the $Si_{1-x}Ge_x$ layer with ionized molecular hydrogen ($H_2^+$) with a dosage in the range of $2\times10^{14}/cm^2$ to $2\times10^{16}/cm^2$;

annealing at a temperature in the range of 650 to 1000 degrees C. for a period of time in the range of 0.1 to 30 minutes; and, in response to the annealing, converting the strained single-crystal $Si_{1-x}Ge_x$ layer to a relaxed single-crystal $Si_{1-x}Ge_x$ layer.

27. The method of claim 26 further comprising:

prior to annealing, implanting the $Si_{1-x}Ge_x$ layer with a species selected from the group including boron, He, and Si, with a dosage in the range of $1\times10^{12}/cm^2$ to $1\times10^{15}/cm^2$.

28. The method of claim 26 further comprising:

after annealing, epitaxially growing a layer of tensile strained Si overlying the single-crystal $Si_{1-x}Ge_x$ layer having a thickness in the range of 50 to 300 Å.

* * * * *